(12) United States Patent
Jung

(10) Patent No.: US 10,990,400 B2
(45) Date of Patent: Apr. 27, 2021

(54) MEMORY APPARATUS AND DATA PROCESSING SYSTEM INCLUDING THE SAME

(71) Applicant: SK hynix Inc., Icheon-si (KR)

(72) Inventor: Jong Ho Jung, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 37 days.

(21) Appl. No.: 16/673,157

(22) Filed: Nov. 4, 2019

(65) Prior Publication Data

US 2020/0264884 A1    Aug. 20, 2020

(30) Foreign Application Priority Data

Feb. 19, 2019  (KR) .................. 10-2019-0018961

(51) Int. Cl.
*G06F 9/30* (2018.01)
*G11C 7/10* (2006.01)
*G06F 13/16* (2006.01)
*G11C 11/409* (2006.01)

(52) U.S. Cl.
CPC ...... *G06F 9/30189* (2013.01); *G06F 9/30105* (2013.01); *G06F 9/30196* (2013.01); *G06F 13/1689* (2013.01); *G11C 7/106* (2013.01); *G11C 11/409* (2013.01)

(58) Field of Classification Search
CPC ............ G06F 9/30189; G06F 9/30196; G06F 13/1689; G06F 9/30105; G06F 13/1668; G11C 7/106; G11C 11/409; G11C 29/46; G11C 29/028; G11C 29/022; G11C 2207/2254; G11C 7/1045; G11C 8/06; G11C 11/4076; G11C 7/22; G11C 7/109; G11C 8/18
See application file for complete search history.

(56) References Cited

U.S. PATENT DOCUMENTS

| 6,295,620 | B1* | 9/2001 | Togo | G11C 29/36 714/719 |
|---|---|---|---|---|
| 2003/0221145 | A1* | 11/2003 | Stong | G11C 29/56 714/718 |
| 2006/0163572 | A1* | 7/2006 | Jeong | G11C 29/14 257/48 |
| 2007/0011535 | A1* | 1/2007 | Anzou | G11C 29/44 714/733 |

FOREIGN PATENT DOCUMENTS

| KR | 1020160148927 A | 12/2016 |
|---|---|---|
| KR | 1020170039451 A | 4/2017 |

* cited by examiner

*Primary Examiner* — Ajay Ojha

(74) *Attorney, Agent, or Firm* — William Park & Associates Ltd.

(57) ABSTRACT

A memory apparatus may include at least one memory, and a memory controller configured to receive an address signal and a command through shared pins and store data, provided from an external source, within the memory controller when a write command is inputted without the address signal.

16 Claims, 3 Drawing Sheets

MEMORY APPARATUS AND DATA PROCESSING SYSTEM INCLUDING THE SAME

CROSS-REFERENCES TO RELATED APPLICATION

The present application claims priority under 35 U.S.C. § 119(a) to Korean application number 10-2019-0018961, filed on Feb. 19, 2019, in the Korean Intellectual Property Office, which is incorporated herein by reference in its entirety.

BACKGROUND

1. Technical Field

Various embodiments generally relate to a semiconductor circuit, and more particularly, to a memory apparatus and a data processing system including the same.

2. Related Art

A memory apparatus (for example, a memory module including a memory chip or a plurality of memory chips and a memory controller) needs to essentially perform a training operation to provide a stable input/output connection with an associated device (for example, a host).

The training operation may be performed for the memory chip or the memory controller, and may be performed by repeating a read or write operation.

The host may control the training operation of the memory apparatus through a predetermined command.

SUMMARY

In an embodiment, a memory apparatus may include: at least one memory; and a memory controller configured to receive an address signal and a command through shared pins and store data, provided from an external source, within the memory controller when a write command is inputted without the address signal.

In an embodiment, a memory apparatus may include: at least one memory; and a memory controller configured to control the at least one memory, wherein the memory controller may include: a command decoder configured to generate a write command, an address recognition command, or a mode register command by decoding a command/address signal provided through shared pins according to a clock signal; a flip-flop configured to latch the write command according to the clock signal; a mode register set configured to generate a training mode signal according to the mode register command; a first logic circuit configured to perform a logic operation on the address recognition command and the training mode signal and output an output signal; and a second logic circuit configured to generate an internal write signal according to the signal latched in the flip-flop and the output signal of the first logic circuit.

In an embodiment, a data processing system may include: a memory apparatus, including at least one memory and a memory controller, for controlling the at least one memory and configured to receive an address signal and a command through shared pins and configured to store data provided from a host in the at least one memory or the memory controller when a write command is received by the memory controller, wherein the host is configured to provide the memory apparatus with the write command, without the address signal, in a training operation of the memory apparatus.

DETAILED DESCRIPTION

Figure 1:
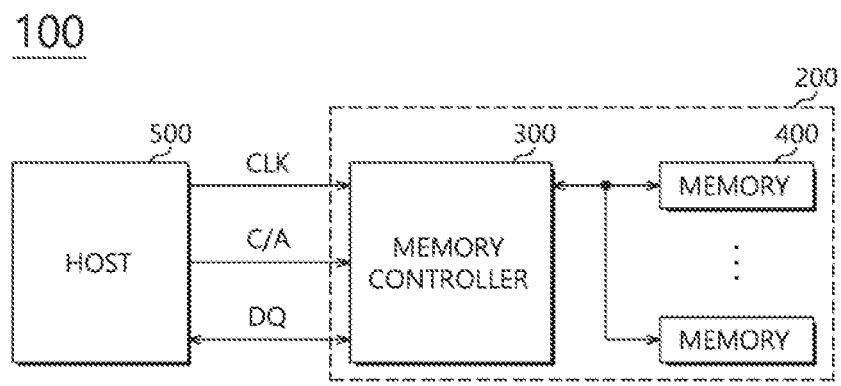
FIG. 1 is a diagram illustrating a configuration of a data processing system in accordance with an embodiment.

Hereinafter, a memory apparatus and a data processing system including the same will be described below with reference to the accompanying drawings through various examples of embodiments.

The embodiments according to the concept of the present disclosure can be modified in various ways and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

A memory apparatus capable of stably and simply controlling a training operation and a data processing system including the same are described herein.

FIG. 1 is a diagram illustrating a configuration of a data processing system in accordance with an embodiment.

Referring to FIG. 1, a data processing system 100 in accordance with the embodiment may include a memory apparatus 200 and a host 500.

The memory apparatus 200 may be a memory module.

The memory apparatus 200, for example, may be a nonvolatile dual in-line memory module (NVDIMM).

The NVDIMM may be classified into NVDIMM-P, NVDIMM-N, and NVDIMM-F.

For example, the NVDIMM-P is a type of a random access memory for a computer system that may include a volatile part, which loses previously stored information when power is turned off, and a nonvolatile part which retains previously stored information even though power is turned off (for example, unexpected power failure, system crash, or general shutdown). The NVDIMM-P may include a flash memory (for example, a NAND flash or a ZNAND flash) as the nonvolatile memory and a dynamic random access memory (DRAM) as the volatile memory.

The memory apparatus 200 may include a memory controller 300 and a plurality of memories 400.

The plurality of memories 400 may include a nonvolatile memory such as a NAND flash and a volatile memory such as a DRAM.

Among the plurality of memories 400, some may include the nonvolatile memory, NAND flash, and others may include the volatile memory, DRAM.

The memory controller 300 may receive a clock signal CLK and a command/address signal C/A from the host 500.

The memory controller 300 may receive data DQ from the host 500 and transmit data outputted from the plurality of memories 400 to the host 500.

The host 500 may share predetermined pins (not illustrated) for transmission of a command and an address signal without separately using pins for the address signal and the command, and transmit the command/address signal C/A to the memory controller 300 through the predetermined pins (hereinafter, shared pins).

The word "predetermined" as used herein with respect to the number and location of pins means that the number of pins is determined prior to the use of the pins. For some embodiments, the number is determined before the process begins. In other embodiments, the number is determined during the process but before the parameter is used in the process.

The host 500 may transmit the command or the address signal to the memory controller 300 through the shared pins based on the clock signal CLK.

The host 500 may provide a mode register command and the address signal to the memory controller 300 at predetermined times by using the command/address signal C/A, thereby allowing the memory controller 300 to enter a training mode or to escape from the training mode to a normal mode.

The host 500 may provide a write command and an address recognition command to the memory controller 300 at predetermined times by using the command/address signal C/A, without discriminating between the training mode and the normal mode, thereby controlling a write operation for the memory apparatus 200.

The address recognition command may be a command for allowing the host 500 to recognize that the address signal is provided to the memory controller 300.

Figure 2:
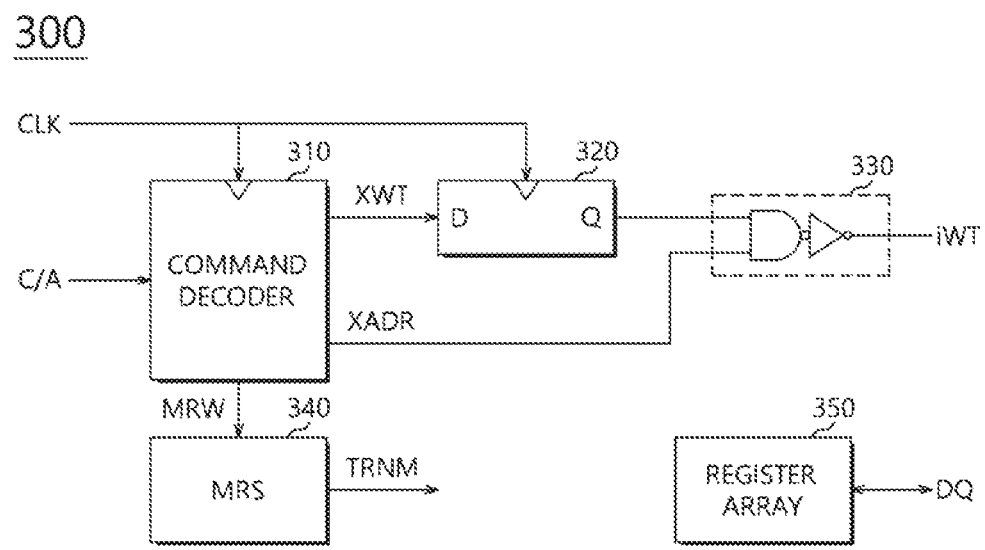
FIG. 2 is a diagram illustrating a configuration of a memory controller of FIG. 1.

FIG. 2 is a diagram, illustrating a configuration of the memory controller of FIG. 1.

As illustrated in FIG. 2, the memory controller 300 may include a command decoder 310, a flip-flop 320, a logic circuit 330, a mode register set (MRS) 340, and a register array 350.

The command decoder 310 may generate a write command XWT, an address recognition command XADR, or a mode register command MRW by decoding the command/address signal C/A according to the clock signal CLK.

The address recognition command XADR may be a command to allow the host 500 to recognize that the address signal is provided to the memory controller 300.

The flip-flop 320 may latch the write command XWT according to the clock signal CLK.

The logic circuit 330 may output an internal write signal iWT by performing an AND operation on the signal latched in the flip-flop 320, that is, the write command XWT and the address recognition command XADR.

In such an embodiment, the command decoder 310 and the flip-flop 320 operate based on the clock signal CLK. Accordingly, when the write command XWT is activated to a high level and the address recognition command XADR is activated to a high level after one cycle time 1tCK of the clock signal CLK. A high level may be applied to the two input terminals of the logic circuit 330, so that the internal write signal iWT may be activated.

The MRS 340 may activate a training mode signal TRNM to a high level or deactivate the training mode signal TRNM to a low level according to the mode register command MRW.

The training mode signal TRNM is a signal for allowing the memory controller 300 to enter the training mode, and may be used in internal circuit components of the memory controller 300.

The register array 350 may store data provided from the host 500 before the data is written in the memory 400 in a write operation. The register array 350 may also store data outputted from the memory 400 before the data is transmitted to the host 500 in a read operation.

In a normal write operation, the data provided from the host 500 may be written in the memory 400 via the register array 350.

However, in a write operation, according to the training mode, the data provided from the host 500 may be stored in the register array 350. Then, the data may be transmitted back to the host 500 in a subsequent read operation.

The register array 350 may perform a data storage operation when the internal write signal iWT is activated.

Meanwhile, the address signal, provided as the command/address signal C/A from the host 500, may be processed by other circuit components of the memory controller 300, such as an address decoder or the like. The address signal may be used for a write operation and a read operation. The illustration and description of the configurations will be omitted.

Figure 3:
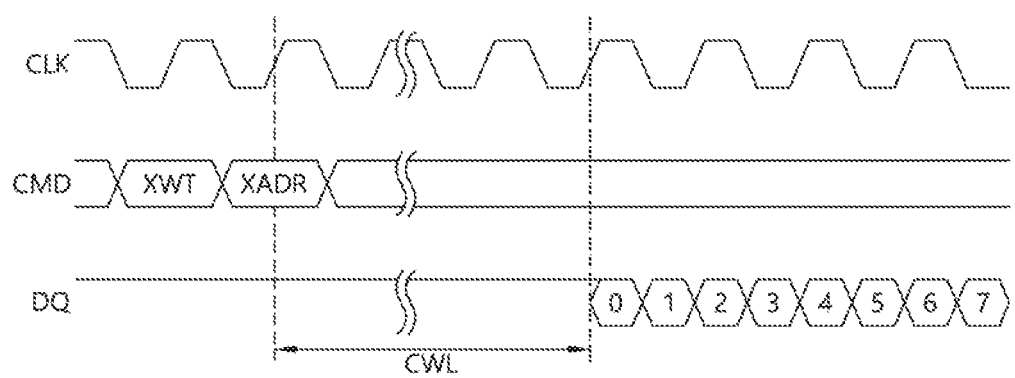
FIG. 3 is a diagram illustrating a training operation control method in accordance with an embodiment.

FIG. 3 is a diagram, illustrating a training operation control method, in accordance with the embodiment.

As illustrated in FIG. 3, the host 500 may provide the memory controller 300 with the write command XWT and the address recognition command XADR at an interval of one cycle time 1tCK based on the clock signal CLK.

When the write command XWT and the address recognition command XADR are both activated, the memory controller 300 may write the data DQ, provided from the host 500, in the register array 350, after a predetermined time (CWL: CAS Latency).

As described above, in the normal write operation, the data DQ, provided from the host 500, may be written in the memory 400 via the register array 350.

However, in the write operation, according to the training mode (that is, when the memory controller 300 enters the training mode according to the training mode signal TRNM), the data DQ, provided from the host 500, may be stored in the register array 350. Then, the data may be transmitted back to the host 500 in a subsequent read operation.

In the training mode, the write operation may be repeated a plurality of times, and the host 500 may provide the memory controller 300 with the write command XWT and the address recognition command XADR at an interval of one cycle time 1tCK for each write operation.

Figure 4:
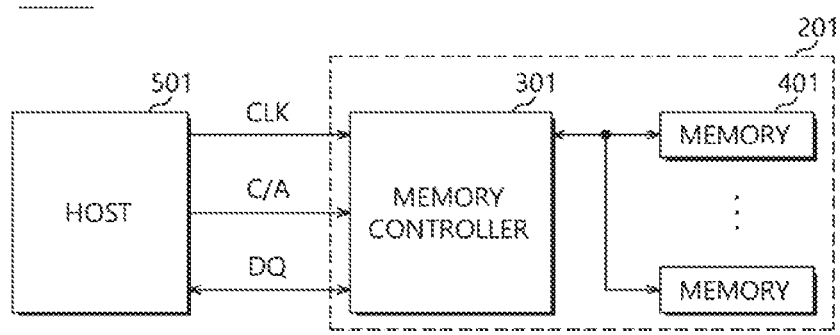
FIG. 4 is a diagram illustrating a configuration of a data processing system in accordance with another embodiment.

FIG. 4 is a diagram, illustrating a configuration of a data processing system, in accordance with another embodiment.

Referring to FIG. 4, a data processing system 101, in accordance with another embodiment, may include a memory apparatus 201 and a host 501.

The memory apparatus 201 may be a memory module.

The memory apparatus 201, for example, may be an NVDIMM.

The NVDIMM may be classified into NVDIMM-P, NVDIMM-N, and NVDIMM-F.

The memory apparatus 201 may include a memory controller 301 and a plurality of memories 401.

The plurality of memories 401 may include a nonvolatile memory such as a NAND flash and a volatile memory such as a DRAM.

Among the plurality of memories 401, some may include the nonvolatile memory, NAND flash, and others may include the volatile memory, DRAM.

The memory controller 301 may receive a clock signal CLK and a command/address signal C/A from the host 501.

The memory controller 301 may receive data DQ from the host 501 and transmit data outputted from the plurality of memories 401 to the host 501.

The host 501 may share predetermined pins (not illustrated) for transmission of a command and an address signal without separately using pins for the address signal and the command, and transmit the command/address signal C/A to the memory controller 301 through the predetermined pins (hereinafter, shared pins).

The host 501 may transmit the command or the address signal to the memory controller 301 through the shared pins based on the clock signal CLK.

The host 501 may provide a mode register command and the address signal to the memory controller 301 at predetermined times by using the command/address signal C/A, thereby allowing the memory controller 301 to enter a training mode or to escape from the training mode to a normal mode.

In the normal mode, the host 501 may provide a write command and an address recognition command to the memory controller 301 at predetermined times by using the command/address signal C/A, thereby controlling a write operation for the memory apparatus 201.

The address recognition command may be a command for allowing the host 501 to recognize that the address signal is provided to the memory controller 301.

In an embodiment, in the normal mode, the host 501 may control the write operation for the memory apparatus 201 by providing the write command and the address recognition command to the memory controller 301 at predetermined times since it is not possible to simultaneously transmit the command and the address signal due to the use of the shared pins.

However, in the training mode, since data for a training operation is stored in the memory controller 301 (for example, a register) instead of the memory 401, the address signal is not required. That is, the address recognition command might not be provided to the memory controller 301. In other words, In the training mode, the host 501 may provide only the write command to the memory controller 301 without the address recognition command (the address signal), thereby controlling the write operation for the memory apparatus 201.

Accordingly, in the normal mode, the host 501 provides the write command and the address recognition command, so that data provided by the host 501 may be written in the plurality of memories 401 of the memory apparatus 201. In the training mode, the host 501 provides only the write command, without the address recognition command, so that data provided by the host 501 may be written in the memory controller 301.

Figure 5:
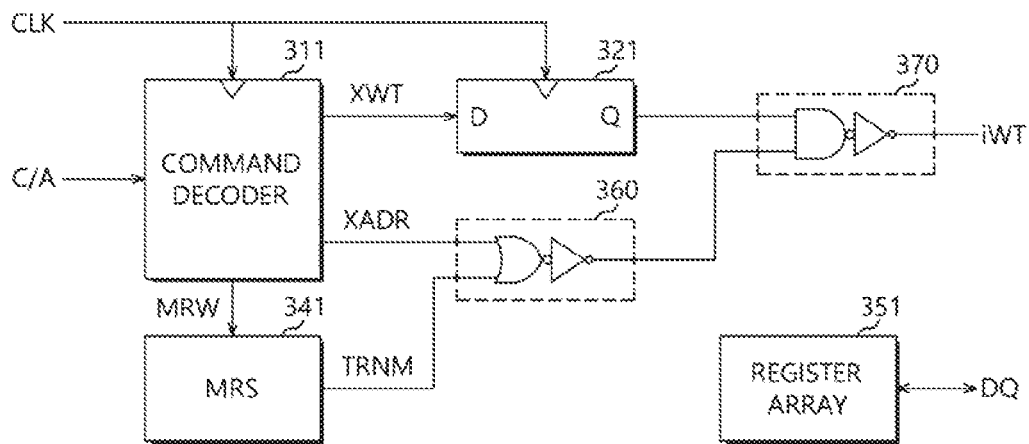
FIG. 5 is a diagram illustrating a configuration of a memory controller of FIG. 4.

FIG. 5 is a diagram, illustrating a configuration of the memory controller of FIG. 4.

Referring to FIG. 5, the memory controller 301 may include a command decoder 311, a flip-flop 321, a mode register set (MRS) 341, a register array 351, a first logic circuit 360, and a second logic circuit 370.

The command decoder 311 may generate a write command XWT, an address recognition command XADR, or a mode register command MRW by decoding the command/address signal C/A according to the clock signal CLK.

The address recognition command XADR may be a command to allow the host 501 to recognize that the address signal is provided to the memory controller 301.

The flip-flop 321 may latch the write command XWT according to the clock signal CLK.

The MRS 341 may activate a training mode signal TRNM to a high level or deactivate the training mode signal TRNM to a low level according to the mode register command MRW.

The training mode signal TRNM is a signal for allowing the memory controller 301 to enter the training mode, and may be used in internal training mode-related circuit components of the memory controller 301.

The first logic circuit 360 may perform an OR operation based on the address recognition command XADR and the training mode signal TRNM to output an OR operation result.

The second logic circuit 370 may output an internal write signal iWT by performing an AND operation based on the signal latched in the flip-flop 321 (the write command XWT) and the output signal of the first logic circuit 360.

In such an embodiment, the command decoder 311 and the flip-flop 321 operate based on the clock signal CLK. Accordingly, when the write command XWT is activated to a high level and either the training mode signal TRNM or the address recognition command XADR is activated to a high level after one cycle time 1tCK of the clock signal CLK, a high level is applied to two input terminals of the second logic circuit 370 so that the internal write signal iWT may be activated.

In the normal mode, since the training mode signal TRNM is deactivated to a low level, the training mode may be activated when the write command XWT is activated to a high level and the address recognition command XADR is activated to a high level after one cycle time 1tCK of the clock signal CLK, thereby activating the internal write signal iWT.

In the training mode, since the training mode signal TRNM is already activated to a high level, only the write command XWT is activated to a high level to activate the internal write signal iWT may be activated since the output of the first logic circuit 360 will be a high level regardless of the logic level of the address recognition command XADR.

The register array 351 may store data provided from the host 501 before the data is written in the memory 401 in a write operation. The register array 351 may also store data outputted from the memory 401 before the data is transmitted to the host 501 in a read operation.

In a normal write operation, the data provided from the host 501 may be written in the memory 401 via the register array 351.

However, in a write operation, according to the training mode, the data provided from the host 501 may be stored in the register array 351. Then, the data may be transmitted back to the host 501 in a subsequent read operation.

The register array 351 may perform a data storage operation when the internal write signal iWT is activated.

Meanwhile, the address signal, provided as the command/address signal C/A from the host 501, may be processed by other circuit components of the memory controller 301, such as an address decoder or the like. The address signal may be used for a write operation and a read operation. The illustration and description of the configurations will be omitted.

Figure 6:
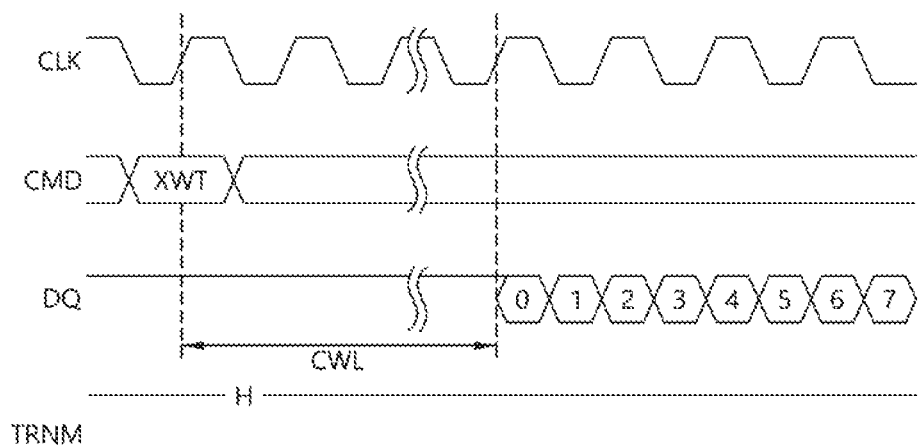
FIG. 6 is a diagram illustrating a training operation control method in accordance with another embodiment.

FIG. 6 is a diagram, illustrating a training operation control method, in accordance with another embodiment.

Referring to FIG. 6, the host 501 may provide the command/address signal C/A to the memory controller 301, thereby activating the training mode signal TRNM to a high level and allowing the memory controller 301 to enter the training mode.

In the state in which the memory controller 301 enters the training mode, the host 501 provides only the write command XWT to the memory controller 301 based on the clock signal CLK.

When the write command XWT is activated, the memory controller 301 may write the data DQ, provided from the host 501, in the register array 351, after a predetermined time (CWL: CAS Latency).

The data stored in the register array 351 may be transmitted back to the host 501 in a subsequent read operation.

In the training mode, the write operation may be repeated a plurality of times, and the host 501 may provide the memory controller 301 with only the write command XWT for each write operation, so that the write operation of the training mode may be completed.

Meanwhile, the normal write operation may be performed in the same manner as that illustrated in FIG. 3, and the data DQ, provided by the host 501, may be written in the memory 401 via the register array 351.

While various embodiments have been described above, it will be understood to those skilled in the art that the embodiments described are examples only. Accordingly, the memory apparatus and the data processing system including the same described herein should not be limited based on the described embodiments.

What is claimed is:

1. A memory apparatus comprising:
   at least one memory; and
   a memory controller configured to receive an address signal and a command through shared pins and store data, provided from an external source, within the memory controller when a write command is inputted without the address signal.

2. The memory apparatus according to claim 1, wherein the memory apparatus includes a nonvolatile dual in-line memory module (NVDIMM), and
   wherein the memory includes a nonvolatile memory and a volatile memory.

3. The memory apparatus according to claim 1, wherein the memory controller is configured to store therein the data, provided from the external source, according to a training mode signal when the write command is inputted without the address signal.

4. The memory apparatus according to claim 1, wherein the memory controller is configured to store the data, provided from the external source, according to an input of the write command, inputted without the address signal, when the training mode signal is activated, and
   to store the data, provided from the external source, in the at least one memory, according to an address recognition command, generated according to an input of the address signal and the input of the write command when the training mode signal is deactivated.

5. The memory apparatus according to claim 1, wherein the memory controller comprises:
   a command decoder configured to generate the write command, an address recognition command, or a mode register command by decoding the command/address signal provided through the shared pins according to the clock signal;
   a flip-flop configured to latch the write command according to the clock signal;
   a mode register set configured to generate a training mode signal according to the mode register command;
   a first logic circuit configured to perform a logic operation on the address recognition command and the training mode signal and output an output signal; and
   a second logic circuit configured to generate an internal write signal according to the signal latched in the flip-flop and the output signal of the first logic circuit.

6. The memory apparatus according to claim 5, further comprising:
   a register array configured to store the data, provided from the external source, before the data is written in the at least one memory when the internal write signal is activated and to store data outputted from the at least one memory before the data is transmitted to the external source in a read operation.

7. A memory apparatus comprising:
   at least one memory; and
   a memory controller configured to control the at least one memory,
   wherein the memory controller comprises:
   a command decoder configured to generate a write command, an address recognition command, or a mode register command by decoding a command/address signal provided through shared pins according to a clock signal;
   a flip-flop configured to latch the write command according to the clock signal;
   a mode register set configured to generate a training mode signal according to the mode register command;
   a first logic circuit configured to perform a logic operation on the address recognition command and the training mode signal and output an output signal; and
   a second logic circuit configured to generate an internal write signal according to the signal latched in the flip-flop and the output signal of the first logic circuit.

8. The memory apparatus according to claim 7, wherein the memory apparatus includes a nonvolatile dual in-line memory module (NVDIMM), and
   wherein the memory includes a nonvolatile memory and a volatile memory.

9. The memory apparatus according to claim 7, wherein the memory controller further comprises:
   a register array configured to store data, provided from an external source, before the data is written in the at least one memory when the internal write signal is activated, or to store data outputted from the at least one memory before the data is transmitted to the external source in a read operation.

10. A data processing system comprising:
a memory apparatus, including at least one memory and a memory controller, for controlling the at least one memory and configured to receive an address signal and a command through shared pins and configured to store data provided from a host in the at least one memory or the memory controller when a write command is received by the memory controller,
wherein the host is configured to provide the memory apparatus with the write command, without the address signal, in a training operation of the memory apparatus.

11. The data processing system according to claim 10, wherein the host is configured to provide the memory apparatus with the address signal and the write command in a normal write operation of the memory apparatus.

12. The data processing system according to claim 10, wherein the memory apparatus includes a nonvolatile dual in-line memory module (NVDIMM), and
wherein the at least one memory includes a nonvolatile memory and a volatile memory.

13. The data processing system according to claim 10, wherein the memory apparatus is configured to store the data, provided from the host, in the memory controller according to a training mode signal when the write command is inputted regardless of input of the address signal.

14. The data processing system according to claim 10, wherein the memory apparatus is configured to store the data, provided from the host, in the memory controller according to input of the write command regardless of input of the address signal when the training mode signal is activated, and to store the data, provided from the host, in the at least one memory according to an address recognition command generated according to the input of the address signal and the write command when the training mode signal is deactivated.

15. The data processing system according to claim 10, wherein the memory controller comprises:
a command decoder configured to generate the write command, an address recognition command, or a mode register command by decoding the command/address signal provided through the shared pins according to a clock signal;
a flip-flop configured to latch the write command according to the clock signal;
a mode register set configured to generate a training mode signal according to the mode register command;
a first logic circuit configured to perform a logic operation on the address recognition command and the training mode signal and output an output signal; and
a second logic circuit configured to generate an internal write signal according to the signal latched in the flip-flop and the output signal of the first logic circuit.

16. The data processing system according to claim 15, further comprising:
a register array configured to store the data, provided from the host, before the data is written in the at least one memory when the internal write signal is activated, or to store data outputted from the at least one memory before the data is transmitted to the host in a read operation.

* * * * *